United States Patent
Gurevich et al.

[11] Patent Number: 5,727,622
[45] Date of Patent: Mar. 17, 1998

[54] HEAT RADIATING ELEMENT

[75] Inventors: Alex Gurevich, Petah-Tikva; Ilya Khurin, Hadera; Yuval Bromberg, Ramat-Hasharon, all of Israel

[73] Assignee: Elisra Gan Ltd., Tel Aviv, Israel

[21] Appl. No.: 732,835

[22] Filed: Oct. 15, 1996

Related U.S. Application Data

[63] Continuation of Ser. No. 400,104, Mar. 6, 1995, abandoned.

[30] Foreign Application Priority Data

Mar. 4, 1994 [IL] Israel ........................................ 108860

[51] Int. Cl.$^6$ ........................................................ F28F 7/00
[52] U.S. Cl. .................... 165/80.3; 165/185; 165/907; 165/122; 361/697; 257/722
[58] Field of Search ........................... 165/185, 907, 165/122, 80.3, 903; 361/697; 257/722

[56] References Cited

U.S. PATENT DOCUMENTS

| | | | |
|---|---|---|---|
| 2,112,743 | 3/1938 | Poole | 165/185 |
| 3,232,344 | 2/1966 | Andersson et al. | 165/156 |
| 3,302,704 | 2/1967 | Valyi | 165/907 X |
| 3,598,180 | 8/1971 | Moore, Jr. | 165/133 |
| 4,296,455 | 10/1981 | Leaycraft et al. | 165/80.3 X |
| 4,790,373 | 12/1988 | Raynor | 165/122 X |
| 4,884,631 | 12/1989 | Rippel | 361/697 X |
| 4,971,143 | 11/1990 | Hogan | 165/122 |
| 5,002,123 | 3/1991 | Nelson et al. | 165/185 X |
| 5,123,982 | 6/1992 | Kuzay | 165/907 X |
| 5,180,001 | 1/1993 | Okada et al. | 165/907 X |
| 5,205,353 | 4/1993 | Willemsen et al. | 165/185 X |
| 5,259,206 | 11/1993 | Dankowski | 165/122 |
| 5,267,611 | 12/1993 | Rosenfeld | 165/104.26 X |
| 5,335,722 | 8/1994 | Wu | 165/122 |
| 5,358,032 | 10/1994 | Arai et al. | 165/185 X |

FOREIGN PATENT DOCUMENTS

| | | | |
|---|---|---|---|
| 0059199 | 5/1981 | Japan | 165/907 |
| 0162195 | 8/1985 | Japan | 165/907 |
| 63-140292 | 6/1988 | Japan | . |
| 4-208557 | 11/1990 | Japan | . |
| 3-41753 | 2/1991 | Japan | . |
| 5-230799 | 2/1992 | Japan | . |
| 4143526 | 5/1992 | Japan | 165/907 |
| 0482711 | 4/1938 | United Kingdom | 165/907 |
| WO 91/08432 | 6/1991 | WIPO | . |
| WO 94/02793 | 2/1994 | WIPO | . |

OTHER PUBLICATIONS

Rosenbaum et al., Efficient and Simple Step Heat Exchangers, 1981, pp. 593–594.

*Primary Examiner*—John Rivell
*Assistant Examiner*—Christopher Atkinson
*Attorney, Agent, or Firm*—Gary M. Nath; Nath & Associates

[57] ABSTRACT

A heat radiating element is made essentially of a porous heat conducting material, the porosity being such so as to allow penetration them through of a cooling fluid.

12 Claims, 4 Drawing Sheets

HEAT RADIATING ELEMENT

This application is a Continuation of U.S. patent application Ser. No. 08/400,104, filed Mar. 6, 1995, now abandoned the contents of which are incorporated herein in their entirety.

FIELD OF THE INVENTION

The present invention is generally in the field of heat sinks and more particularly concerns a heat radiating element and a heat sink comprising it, intended for cooling heat producing components, particularly heat producing electronic or electric components.

BACKGROUND OF THE INVENTION

Many electronic or electric components produce quite large amounts of heat and in order to ensure that such components are not overly heated, it is necessary to drive the heat away. In some electronic components this may be achieved by attaching radiating fins made of a heat conducting material to the electronic component.

In order to increase the cooling capacity, electronic components may be placed in close contact with a heat sink, consisting typically of a plate carrying heat radiating fins. By forcing air onto the heat sink by a blower, the cooling efficiency may be further increased. For effective cooling, large radiating surfaces are at times necessary which brings to that such assemblies are relatively bulky.

It is the object of the present invention to provide a relatively compact heat sink for cooling electronic and electric components and the like.

SUMMARY OF THE INVENTION

The present invention provides a heat radiating element made essentially of a porous heat conducting material, the porosity being such so as to allow penetration them through of a cooling fluid.

The heat radiating element typically forms part of a heat sink which comprises a heat-conductive plate and one or more of said heat radiating elements, being on one or on both sides of the plate and at thermal contact therewith.

The plate, as known per se, may be made of metal, of a heat conductive ceramic material with or without heat conductive coating, a combination of metal and ceramic material, etc.

Said element may typically be made of heat conductive sintered metallic and/or ceramic fibers, powders and nets or may be a combination of any of these, pressed so as to form a compact structure with porosity to allow permeation therethrough of the cooling fluid, and with a high surface to volume ratio (the surface in this regard refers to the effective surface which comes into contact with the cooling fluid).

Such sintered element is typically formed into an elongated strip which may be attached to a heat-conductive plate at one of its narrow dimensions. In order to increase the heat radiating surfaces, the strip may be formed into various closed path configurations (e.g. circular, square, elliptic, triangular, etc.), into non-straight, e.g. wavy line configurations, etc.

The heat sink of the invention typically forms part of an assembly comprising the heat sink and a fan or blower adapted to blow the coolant onto the said elements so as to allow a move efficient heat removal. Such an assembly also forms an aspect of the invention. The cooling fluid may typically be air although other cooling fluids may be used, as known per se, such as liquid nitrogen, etc.

In order to ensure substantially equal distribution of the cooling fluid passing through said heat radiating elements, means are typically provided between said fan and said elements to ensure such distribution.

DETAILED DESCRIPTION OF THE INVENTION

In the following the invention will be described with reference to some non-limiting specific embodiments.

The heat radiating elements in the heat sink of the invention may be made of high conductive metallic or ceramic material. The elements are typically made essentially of sintered fibers, powders or nets made of such materials or of any combination of such fibers, powders and nets, which are formed into a compact structure which is air-permeable and having a high surface-to-volume ratio. (Such elements will be referred to hereinafter as "sintered elements").

The sintered elements have typically a shape of a strip with a porosity of 40–80%. For efficient heat removal by the heat radiating elements, the thickness of the strips should be contingent with the velocity of the coolant gas (typically air), the characteristic size of the building block (the size of the powder particle, the diameter of the fibers, etc.) and the porosity. It was found in accordance with the present invention that for efficient heat removal, the thickness T of a strip, e.g. such having an essentially rectangular cross-sectional shape, should meet the following equation:

$$T \leq \frac{V^{1/2} \cdot D^{3/2} C_p \rho v^{1/2}}{(1-P)\lambda}$$

wherein

V is the coolant gas velocity;

D is the characteristic diameter of the fibers or of the powders (m),

P is the porosity; and $C_p$, $\rho$, $v$ and $\lambda$ are the coolant's specific heat, density, dynamic viscosity and thermal conductivity, respectively.

From structural considerations, the strips' thickness should generally be above 3–5 times that of D.

Figure 1A:
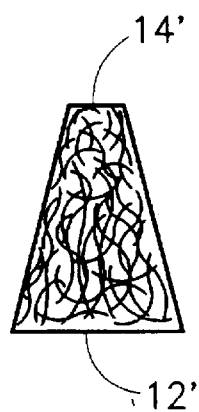
FIG. 1 shows several embodiments of possible cross-sectional shapes of heat radiating elements of the invention.
Figure 1B:
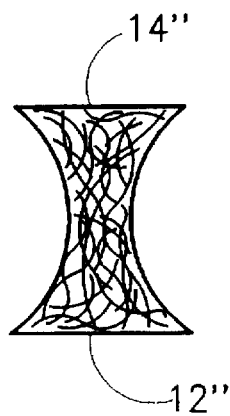

Reference is now being made to FIG. 1 showing examples of various alternative cross-sectional shapes into which the sintered elements may be formed. These consist of strips having a trapezoid cross-sectional shape (FIG. 1(*a*)) a rounded "T" cross-sectional shape (FIG. 1(*b*)) and a rectangular cross-sectional shape (FIG. 3(*c*)). These strips are connected to the heat conducting plate of the heat sinks at one of their narrow faces, these being faces 12', 12" and 12'" or faces 14', 14" and 14'" in FIGS. 1(a), (b) and (c), respectively.

Figure 3:
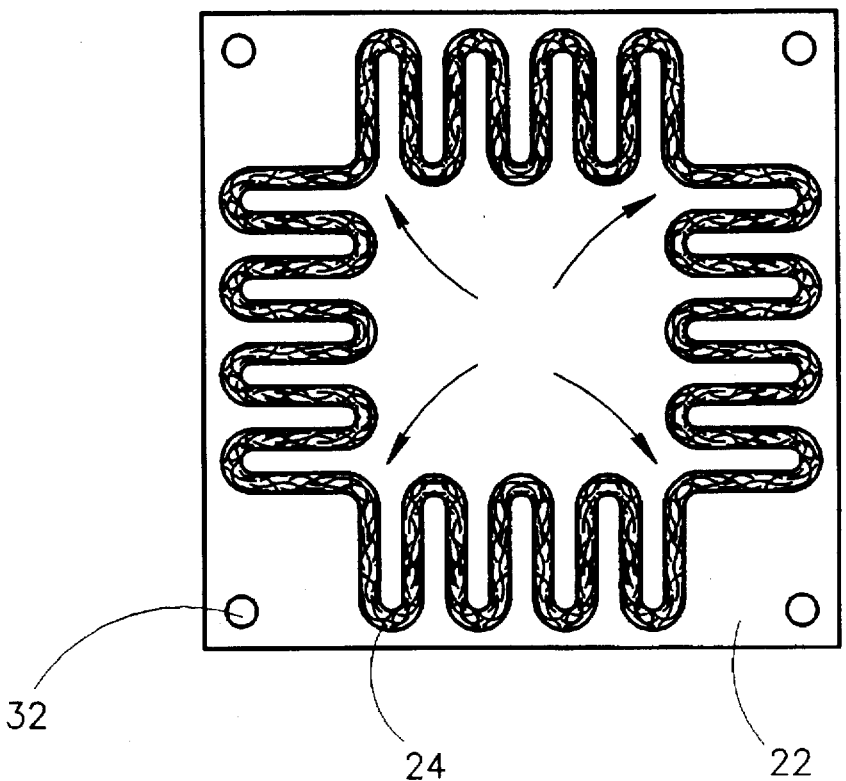
FIG. 3 shows a view of the heat sink of FIG. 2 from above, i.e. from the direction of arrow III in FIG. 2 with the air blower removed.
Figure 2:
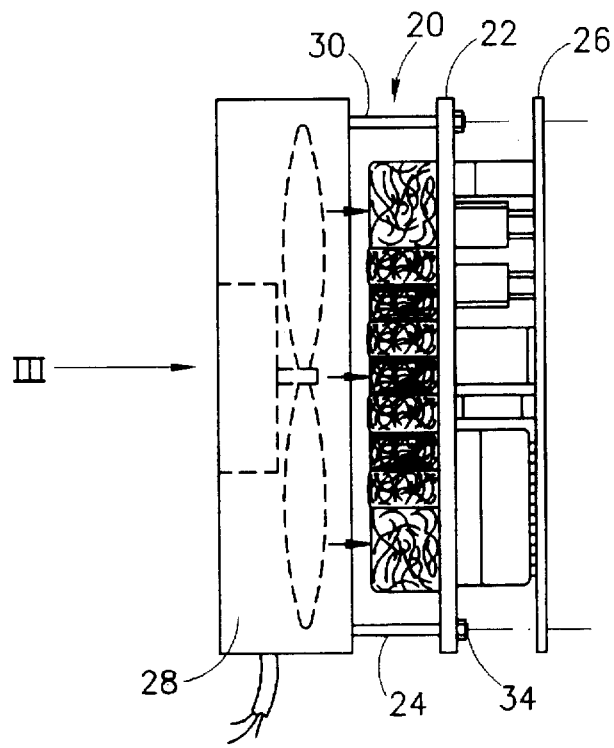
FIG. 2 shows a side view of a heat sink—air blower assembly in accordance with an embodiment of the invention.

Reference is now being made to FIGS. 2 and 3 showing a heat sink in accordance with an embodiment of the invention which is adapted for the removal of heat which is accumulated in electronic or electric components. An example of such a component is a cooling element, such as a Peltier device. It should be noted that while the use for removal of heat from electronic or electric components is a preferred embodiment of the invention, the invention is not limited to such an application and the heat sink may also be used for the removal of heat from various other non-electric or non-electronic components.

Figure 1C:
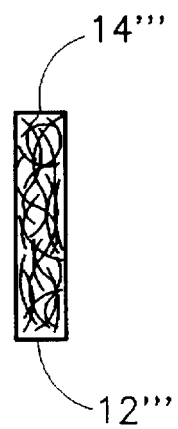

Heat sink 20 shown in FIGS. 2 and 3 comprises a conducting plate 22, typically made of metal such as copper, and a heat radiating element 24, typically made of sintered copper fibers which may have a diameter of about 0.1–1.0 mm and are 15–40 mm long. Element 24 of this embodiment has the form of a strip having a rectangular cross-sectional shape, as shown in FIG. 1(c) and has typically a width of about 5–15 mm and a thickness of about 0.5–10 mm. Such a sintered element has a very high specific surface which is within the range of 800–24,000 m²/m³.

The sintered element has typically a uniform porosity throughout its length. For certain applications the sintered element may have a non-uniform porosity distribution.

The sintered element 24 may be bonded to the heat conductive plate 22 by a number of means including brazing, soldering, diffusion or adhesion bonding.

As can be seen in FIG. 2, plate 22 is in contact with electronic elements of an electronic circuitry 26. Thus, a heat which is produced in the electrode elements is conducted to plate 22 and from there to element 24 where it is radiated.

Heat sink 20 forms part of an assembly comprising also air blower 28 which is connected to heat sink 22 by means of screw-threaded legs 30 which fit into holes 32 in plate 22 and fixed by means of bolt 34. Air blower 28 blows air in the direction of the arrows shown in FIG. 2, the arrows flow into the central space 36 of the heat sink from where it is distributed to the periphery, as represented schematically by the arrows in FIG. 3 and is thus forced through element 24 which are cooled.

Figure 4:
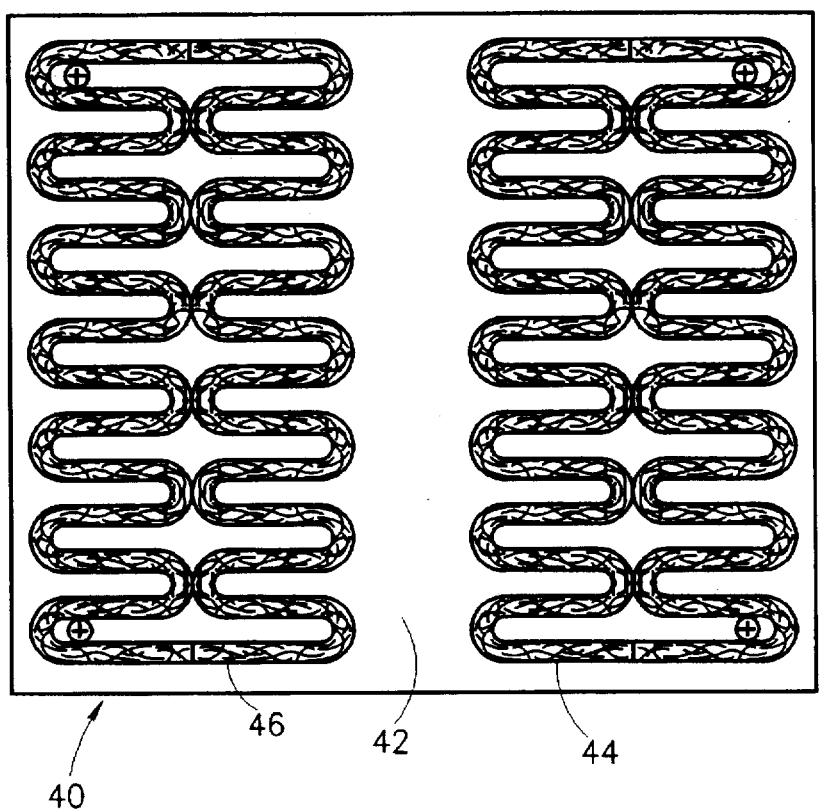
FIG. 4 shows a view from above of a heat sink in accordance with another embodiment of the invention.

Reference is now being made to FIG. 4 showing a view from above of a heat sink in accordance with another embodiment of the invention. Heat sink 40 of this embodiment comprises a plate 42, similiar to the plate 22 of the embodiment in FIGS. 2 and 3, and heat radiating elements 44 and 46 which have a closed-path wavy configuration as shown. It should be noted that rather than two elements, the heat sink of the invention may in principle have any number of a plurality of elements of various configurations.

Figure 5:
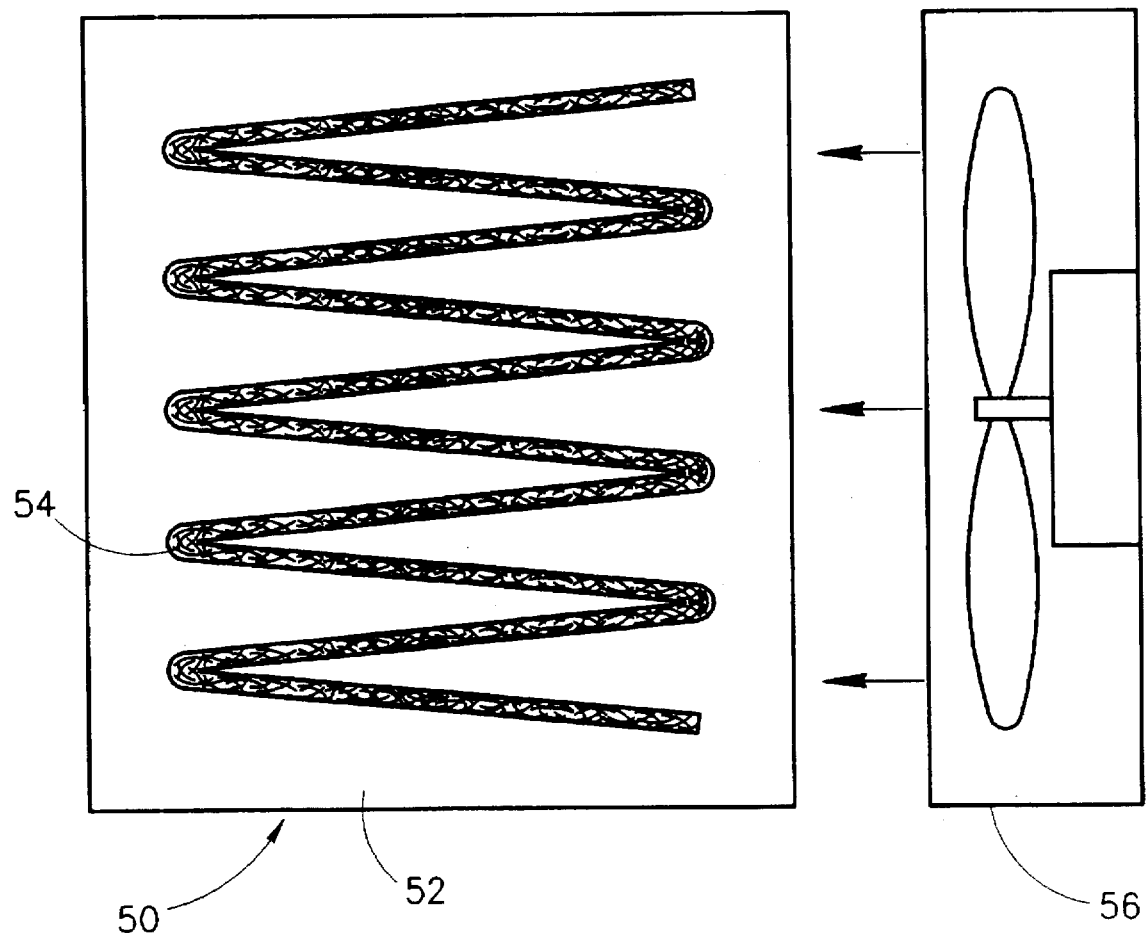
FIG. 5 shows a heat sink—air blower assembly in accordance with a further embodiment of the invention.
Figure 6A:
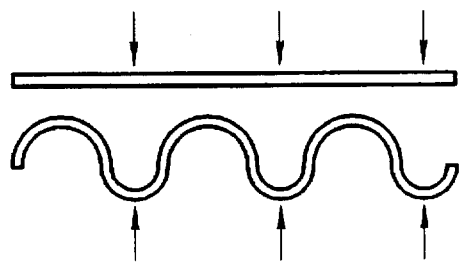
FIG. 6 shows several alternative configurations of the heat radiating elements of the invention.
Figure 6B:
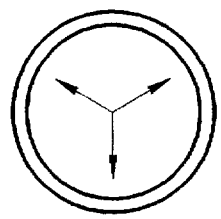
Figure 6C:
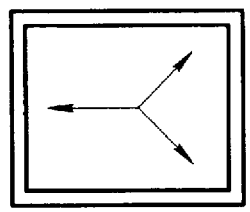
Figure 6D:
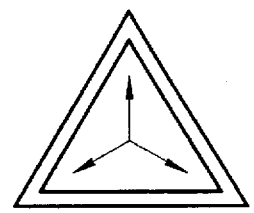
Figure 6E:
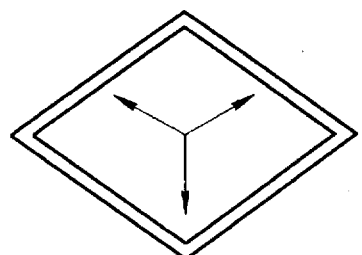
Figure 6F:
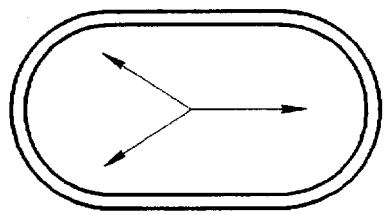
Figure 6G:
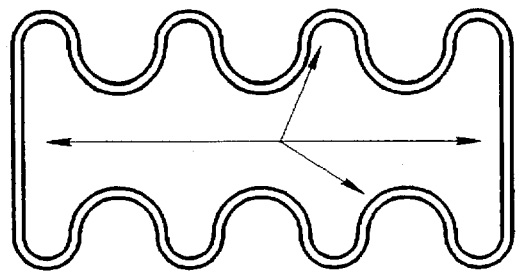

Reference is now being made to FIG. 5 showing a heat sink—air blower assembly in accordance with another embodiment. Heat sink 50 comprises a conducting plate 52 and a heat radiating element 54 which has a wavy line configuration. The assembly of this embodiment comprises an air blower 56 which rather than blowing the air onto the plate from above, such as in the embodiment shown in FIGS. 2 and 3, is adapted to blow air from the side of the plate in the direction of the arrows in FIG. 5.

Reference is now being made to FIG. 6 showing various alternative configurations of the heat element in the heat sink of the invention. These include straight or wavy line configurations (FIG. 5(a)), a circular configuration (FIG. 6(b), a square configuration (FIG. 5(c)), a triangular configuration (FIG. 6(d)), a diamond shape (FIG. 6(e)), an elliptic shape (FIG. 6(f)) and a closed-path wavy configuration (FIG. 6(g)). The direction of airflow through these elements, in each of these embodiments, is represented schematically by arrows. It should be noted that heat sink of the invention may comprise one or a plurality of such elements.

The coverage of the plate by the sintered elements may be within the range of 15–50% $\left( \text{coverage} = \frac{\text{contact area}}{\text{plate area}} \times 100 \right)$,

We claim:

1. An assembly for dissipating heat generated by one or more electric or electronic components, comprising a heat conducting plate in contact with said components; at least one heat dissipating element being in contact with said plate and arranged in a closed loop; and a device for driving coolant gas into said closed loop at a coolant gas velocity V; said element being made of heat conductive sintered metallic or ceramic fibers, powder and nets, or any combination of these, pressed and sintered so as to form a compact structure which is permeable to the cooling gas and having a porosity of about 40–80%; the element having the form of a strip with narrow sides and wide sides and being in contact with the plate through one of its narrow sides, the strip having a thickness T, measured in a direction parallel to the narrow sides, which is at least about 3 times the characteristic diameter of the fibers or of the powder's particles and which obeys the following equation:

$$T \leq \frac{V^{1/2} \cdot D^{3/2} C_p \rho v^{1/2}}{(1-P)\lambda}$$

wherein

D is the characteristic diameter of the fibers or of the powder's particles,

V is the coolant gas velocity,

P is the porosity, and $C_p$, $\rho$, $v$ and $\lambda$ are the coolant gas's specific heat, density, dynamic viscosity and thermal conductivity, respectively, whereby gas directed into the interior of said closed loop flows through said heat dissipating element.

2. An assembly for dissipating heat generated by one or more electric or electronic components according to claim 1, wherein said gas is air and said device is a fan or blower.

3. An assembly for dissipating heat generated by one or more electric or electronic components according to claim 2, wherein said fan or blower is situated so as to cause air to flow in a direction normal to said plate.

4. An assembly for dissipating heat generated by one or more electric or electronic components according to claim 1, wherein said element is made essentially of sintered copper fibers having a diameter of about 0.1–1.0 mm and a length of about 15–40 mm.

5. An assembly for dissipating heat generated by one or more electric or electronic components according to claim 4, having a specific surface which is within the range of 800–24,000 m²/m³.

6. An assembly for dissipating heat generated by one or more electric or electronic components according to claim 1, wherein the strip has an essentially rectangular cross-sectional shape with a width of about 5–15 mm and a thickness of about 0.5–10 mm.

7. An assembly for dissipating heat generated by one or more electric or electronic components according to claim 1, wherein the area of contact between said at last one element and said plate represents about 15–50% of said plate's total area.

8. A heat sink for dissipating heat generated by one or more electric or electronic components, comprising:

a heat conducting plate in contact with said components;

at least one heat dissipating element being in contact with said plate and arranged in a closed loop;

said heat dissipating element being made of a heat conductive metallic or ceramic fibers, nets or powder, or any combination of these, pressed and sintered so as to form a compact structure which is permeable to a cooling gas and having a porosity of about 40–80%;

said heat dissipating element having the form of a strip with narrow sides and wide sides and being in contact with the plate through one of its narrow sides;

said strip having a thickness, measured in a direction parallel to the narrow sides which is at least about 3 times than the characteristic diameter of the fibers or of the powder particles, whereby gas directed into the interior of said closed loop flows through said heat dissipating element.

9. A heat sink according to claim 8, wherein said element is made essentially of sintered copper fibers having a diameter of about 0.1–1.0 mm and a length of about 15–40 mm.

10. A heat sink according to claim 8, having a specific surface which is within the range of 800–2400 $m^2/m^3$.

11. A heat sink according to claim 8, wherein said strip has essentially a rectangular cross-sectional shape with a width of about 5–15 mm and a thickness of about 0.5–10 mm.

12. A heat sink according to claim 8, wherein the area of contact between said at least one element and said plate represents about 15–50% of said plate's total area.

* * * * *